US008872535B2

(12) United States Patent
Naitou

(10) Patent No.: US 8,872,535 B2
(45) Date of Patent: Oct. 28, 2014

(54) CONNECTOR ATTACHING/DETACHING APPARATUS AND TEST HEAD

(75) Inventor: Takashi Naitou, Gunma (JP)

(73) Assignee: Advantest Corporation, Tokyo (JP)

( * ) Notice: Subject to any disclaimer, the term of this patent is extended or adjusted under 35 U.S.C. 154(b) by 687 days.

(21) Appl. No.: 13/127,279

(22) PCT Filed: Nov. 4, 2008

(86) PCT No.: PCT/JP2008/070062
§ 371 (c)(1),
(2), (4) Date: Jul. 12, 2011

(87) PCT Pub. No.: WO2010/052761
PCT Pub. Date: May 14, 2010

(65) Prior Publication Data
US 2011/0260745 A1   Oct. 27, 2011

(51) Int. Cl.
*G01R 31/00*   (2006.01)
*H01R 13/629*   (2006.01)
*G01R 1/04*   (2006.01)

(52) U.S. Cl.
CPC ........ *H01R 13/62905* (2013.01); *G01R 1/0416* (2013.01)
USPC .................................................. 324/756.05

(58) Field of Classification Search
None
See application file for complete search history.

(56) References Cited

U.S. PATENT DOCUMENTS

| 6,325,662 | B1 * | 12/2001 | Tustaniwskyj ................. 439/482 |
| 6,984,974 | B2 * | 1/2006 | Liken et al. ............... 324/750.19 |
| 7,474,531 | B2 * | 1/2009 | Chen et al. ..................... 361/719 |
| 7,746,060 | B2 | 6/2010 | Doi et al. |
| 2008/0100330 | A1 | 5/2008 | Ito et al. |
| 2009/0184720 | A1 | 7/2009 | Doi et al. |

FOREIGN PATENT DOCUMENTS

| JP | 4-21881 | 2/1992 |
| JP | 2002-048846 | 2/2002 |
| KR | 10-2008-0041650 | 5/2008 |
| KR | 10-2008-0082997 | 9/2008 |
| WO | 2007/077807 | 7/2007 |

* cited by examiner

*Primary Examiner* — Paresh Patel
(74) *Attorney, Agent, or Firm* — Greenblum & Bernstein, P.L.C.

(57) ABSTRACT

The connector attaching/detaching apparatus includes a plurality of fitting members that causes connectors to fit with or separate from one another by sliding, guiding members that sequentially causes the plurality of fitting members to slide by moving in an arrangement direction of the fitting means, and a moving apparatus that causes the guiding members to move in the arrangement direction of the fitting members.

10 Claims, 16 Drawing Sheets

CONNECTOR ATTACHING/DETACHING APPARATUS AND TEST HEAD

TECHNICAL FIELD

The present invention relates to a connector attaching/detaching apparatus for attaching and detaching connectors to electrically connect an interface apparatus and a test head main body in a test head of an electronic component test apparatus which tests electronic device under test (hereinafter, referred simply to as IC devices), such as semiconductor integrated circuits, and also relates to a test head comprising the same.

BACKGROUND ART

A test head of an electronic component test apparatus comprises a test head main body electrically connected with a tester via a cable, and an interface apparatus electrically relaying this test head main body and IC devices therebetween.

The interface apparatus is detachably attached to the test head main body thereby to be interchangeable depending on the product type of IC devices etc. To this end, the interface apparatus and the test head main body are electrically connected via connectors, and the test head thus comprises a connector attaching/detaching apparatus using an air cylinder in order for the connectors to be fitted with and separated from one another.

SUMMARY OF THE INVENTION

Problems to be Solved by the Invention

Conventional connector attaching/detaching apparatus has caused all the connectors, which are to connect with the interface apparatus, to be fit with and separate from one another at one time. Consequently, the air cylinder is required to have a large thrust force, and the test head is thus prevented from being downsized because the air cylinder necessarily comes to be large.

In addition, the current electronic component test apparatus tends to be expected to perform an increased number of concurrent tests (the number of IC devices capable of being tested at a time). In response to this, the number of connectors increases and the required attaching and detaching force also increases, thereby rendering the problems of increased size of the air cylinder particularly prominent.

The problems to be solved by the present invention is to provide a connector attaching/detaching apparatus which enables a test head to be downsized and a test head comprising the same

Means for Solving the Problems

According to the present invention, there is provided a connector attaching/detaching apparatus for attaching and detaching connectors which electrically connects an interface apparatus and a test head main body in a test head, wherein the connector attaching/detaching apparatus comprises: a plurality of fitting means that cause the connectors to fit with or separate from one another by sliding; a first guiding member that sequentially causes the plurality of fitting means to slide by moving in an arrangement direction of the fitting means; and a moving means that causes the first guiding member to move in the arrangement direction of the fitting means.

In the above invention, it is preferred that the connector attaching/detaching apparatus further comprises a second guiding member that is arranged symmetrically to the first guiding member and sequentially causes the plurality of fitting means to slide by moving in the arrangement direction of the fitting means, and the moving means causes the second guiding member to move in opposite direction to a movement direction of the first guiding member.

In the above invention, it is preferred that each of the first and second guiding members has a first cam groove or a first cam follower, and the fitting means has a second cam follower or a second cam groove corresponding to the first cam groove or the first cam follower.

In the above invention, it is preferred that the connector attaching/detaching apparatus further comprises a conversion means that converts a force along the arrangement direction of the fitting means into a force along a direction of attaching and detaching of the connectors, and the conversion means causes the interface apparatus to move upward and downward by pressing due to movement of the first and second guiding members.

In the above invention, it is preferred that the conversion means has: a first contacting portion provided on each of the first and second guiding members; and a second contacting portion which is provided on a shaft supporting the interface apparatus and contacts with the first contacting portion, and at least one of the first contacting portion and the second contact portion is inclined.

As a specific configuration of the moving means, a moving means may be mentioned which has: a motor; a feed screw rotatable by driving force of the motor; and nuts into which the feed screw is screwed. It is preferred that the nuts are coupled to each of the first and second guiding members, and each of the first and second guiding members linearly moves along an axis direction of the feed screw by rotation of the feed screw.

In the above invention, it is preferred that the feed screw has: a first screw portion formed with a left-hand thread; and a second screw portion formed with a right-hand thread, the first guiding member is arranged at the first screw portion, and the second guiding member is arranged at the second screw portion so as to be positioned symmetrically to the first guiding member.

As another specific configuration of the moving means, a moving means may be mentioned which has: a motor; a plurality of pulleys rotating by driving force of the motor; and an endless-type belt wound around the plurality of pulleys. It is preferred that the first and second guiding members are held by the belt, and the belt is capable of running by rotation of the plurality of pulleys.

As further specific configuration of the moving means, a moving means may be mentioned which has: an air cylinder; a plurality of pulleys supported to be rotatable, and an endless-type belt wound around the plurality of pulleys. It is preferred that the first and second guiding members are held by the belt, and the belt is coupled to the air cylinder and is capable of running by thrust force of the air cylinder.

According to the present invention, there is provided a test head comprising the above connector attaching/detaching apparatus.

Advantageous Effect of the Invention

According to the present invention, attaching and detaching of considerable number of connectors required for the connection between the interface apparatus and the test head main body may be separately performed in terms of each predetermined number, and therefore the attaching and detaching force required at a time becomes to be small thereby to allow for downsizing of the test head.

DESCRIPTION OF REFERENCE NUMERALS

Figure 1:
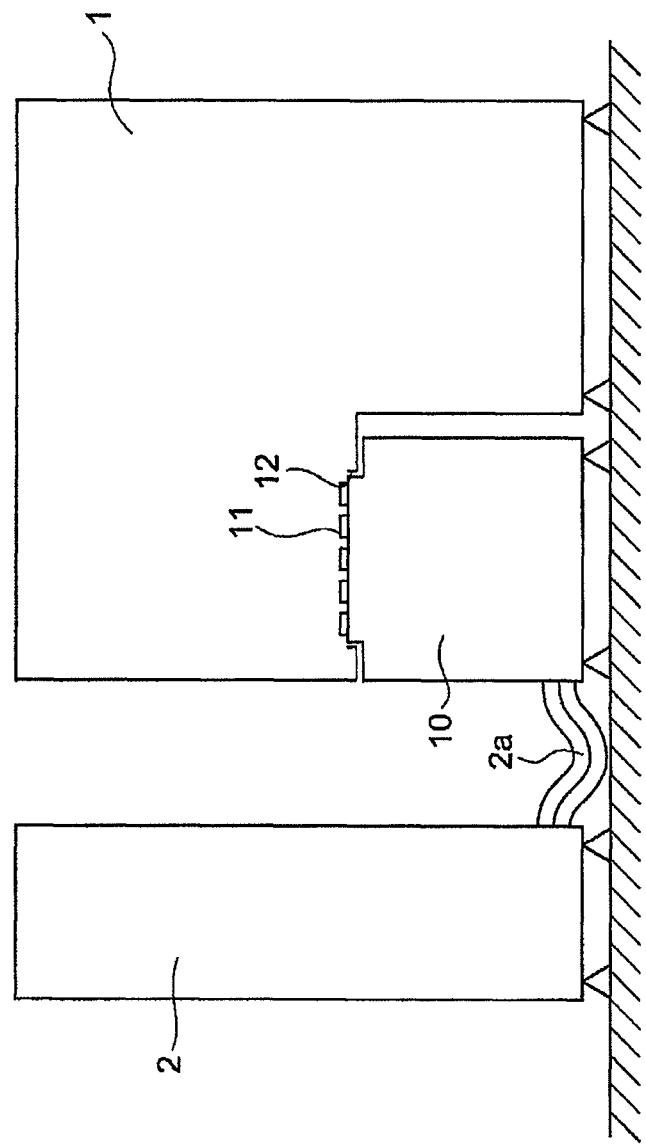
FIG. 1 is a schematic cross-sectional view of an electronic component test apparatus according to a first embodiment of the present invention.

1 . . . handler
   10 . . . test head
3 . . . HIFIX
   30 . . . DSA (Device Specific Adapter)
   31 . . . HIFIX main body
313 . . . second connector
314 . . . projecting portion
4 . . . connector attaching/detaching apparatus
5 . . . guiding member
   51 . . . first guiding member
      511 . . . cam groove
      513 . . . inclined plane
   52 . . . second guiding member
      521 . . . cam groove
      523 . . . inclined plane 6 . . . moving apparatus
   61 . . . motor
      61a . . . driving shaft
   62 . . . first pulley
   63 . . . second pulley
   64 . . . timing belt
   65 . . . feed screw
      65a . . . first screw portion
      65b . . . second screw portion
   66 . . . first nut
   67 . . . second nut
7 . . . fitting member
   71 . . . frame
      711 . . . insertion opening
      712 . . . guiding groove
   72 . . . cam follower
8 . . . HIFIX elevating apparatus
   81 . . . cam follower for elevating
   83 . . . shaft

EMBODIMENTS FOR CARRYING OUT THE INVENTION

Hereinafter, embodiments according to the present invention will be described with reference to the drawings.

<First Embodiment>

FIG. 1 is a schematic cross-sectional view of an electronic component test apparatus according to the first embodiment of the present invention.

The electronic component test apparatus according to the first embodiment of the present invention comprises, as shown in FIG. 1, for example, a handler 1 for handling IC devices, a test head 10 to be electrically connected with IC devices, and a tester main body 2 outputting test signals for IC devices via the test head 10 to perform testing IC devices. This electronic component test apparatus is an apparatus which tests to know whether IC devices will appropriately operate or not in the status where the IC devices are applied with heat stress of high temperature or low temperature (or at room temperature), and classifies the IC devices depending on the test results.

As shown in FIG. 1, at the upper portion of the test head 10, sockets 11 which are electrically connected with IC devices during the test of IC devices are provided. These sockets 11 face into the internal space of the handler 1 via an opening 12 formed with the handler 1, as shown in the same figure, thereby being pressed with IC devices having been carried in the handler 1. Note that, as the handler 1, heat-plate type or chamber type one may be used.

Figure 2:
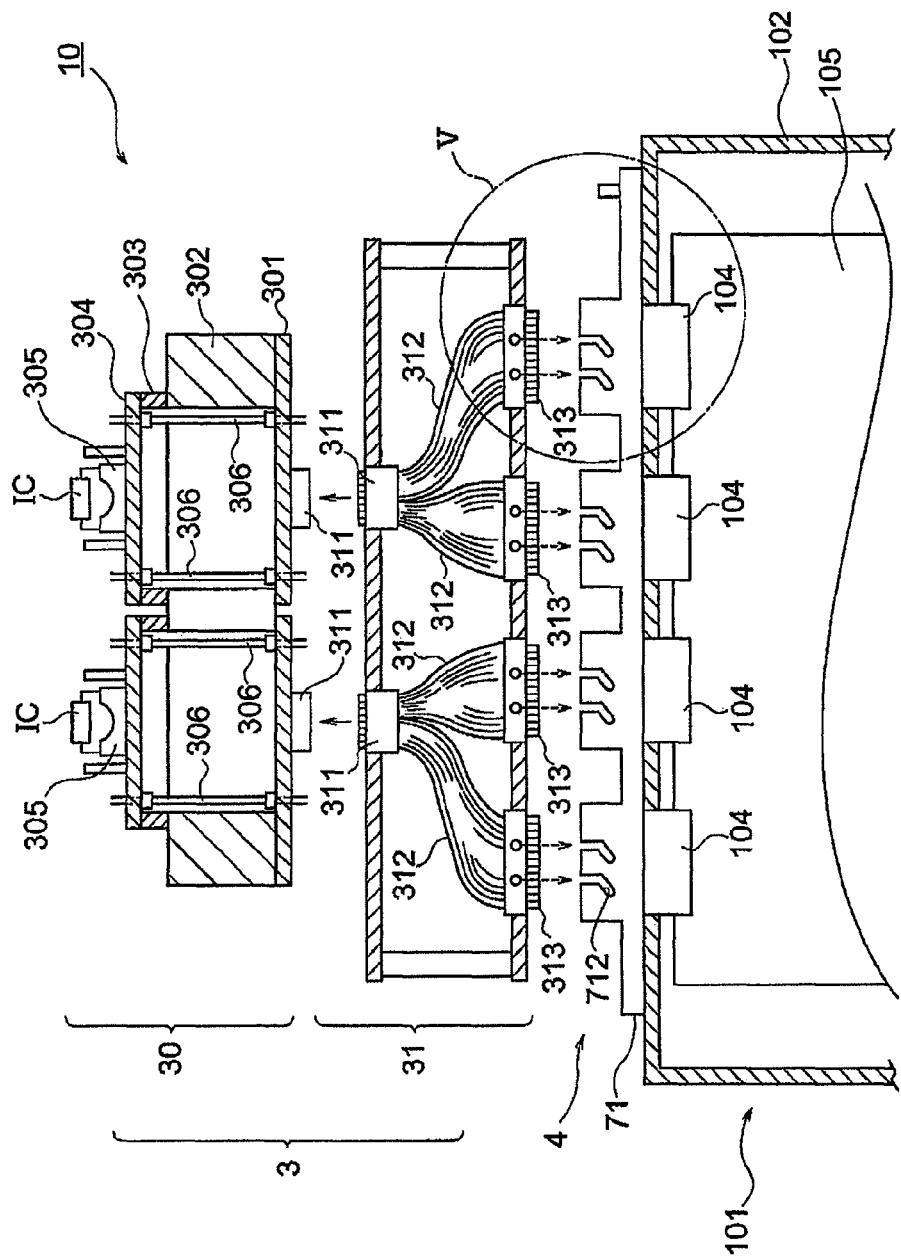
FIG. 2 is a detailed cross-sectional view illustrating a test head according to the first embodiment of the present invention.

FIG. 2 is a detailed cross-sectional view illustrating the test head 10 according to the first embodiment of the present invention.

As shown in FIG. 2, the test head 10 has a HIFIX 3 (interface apparatus) to relay the electrical connection between ICs under test and a test head main body 101, and the test head main body 101 detachably attached to the HIFIX 3.

Moreover, the HIFIX 3 has a HIFIX main body 31 attached to the upper portion of the test head 10 and a DSA (Device Specific Adapter) 30 attached to the upper portion of the HIFIX main body 31.

The DSA 30 has a relaying board 301, a spacing frame 302 provided on the relaying board 301, and socket boards 304 provided on the spacing frame 302 via socket board spacers 303. A plurality of sockets 305 are implemented on the socket boards 304.

The relaying board 301 and the socket boards 304 are connected by connector boards 306 provided therebetween.

In addition, respective connectors 311 are provided for both the relaying board 301 and the HIFIX main body 31, and fitting these connectors 311 with one another allows the DSA 30 and the HIFIX main body 31 to be electrically connected.

Moreover, first connectors 104 are provided at the upper portion of the test head main body 101 while second connectors 313 are provided at the bottom portion of the HIFIX 3, and these first and second connectors 104 and 313 are thus to be fitted with one another to allow the HIFIX 3 to electrically connect with pin electronics cards 105 accommodated in the test head 10. These pin electronics cards 105 are connected with the tester main body 2 via cables 2a shown in FIG. 1.

According to the present embodiment, the HIFIX 3 and the test head main body 101 are electrically connected with each other by means of considerable number of the connectors 104 and 313. Detachably attaching these connectors 104 and 313 requires a large power. To this end, the test head main body 101 comprises a connector attaching/detaching apparatus 4 as shown in FIG. 3 and FIG. 4 in order to detachably attach these connectors 104 and 313.

Figure 3:
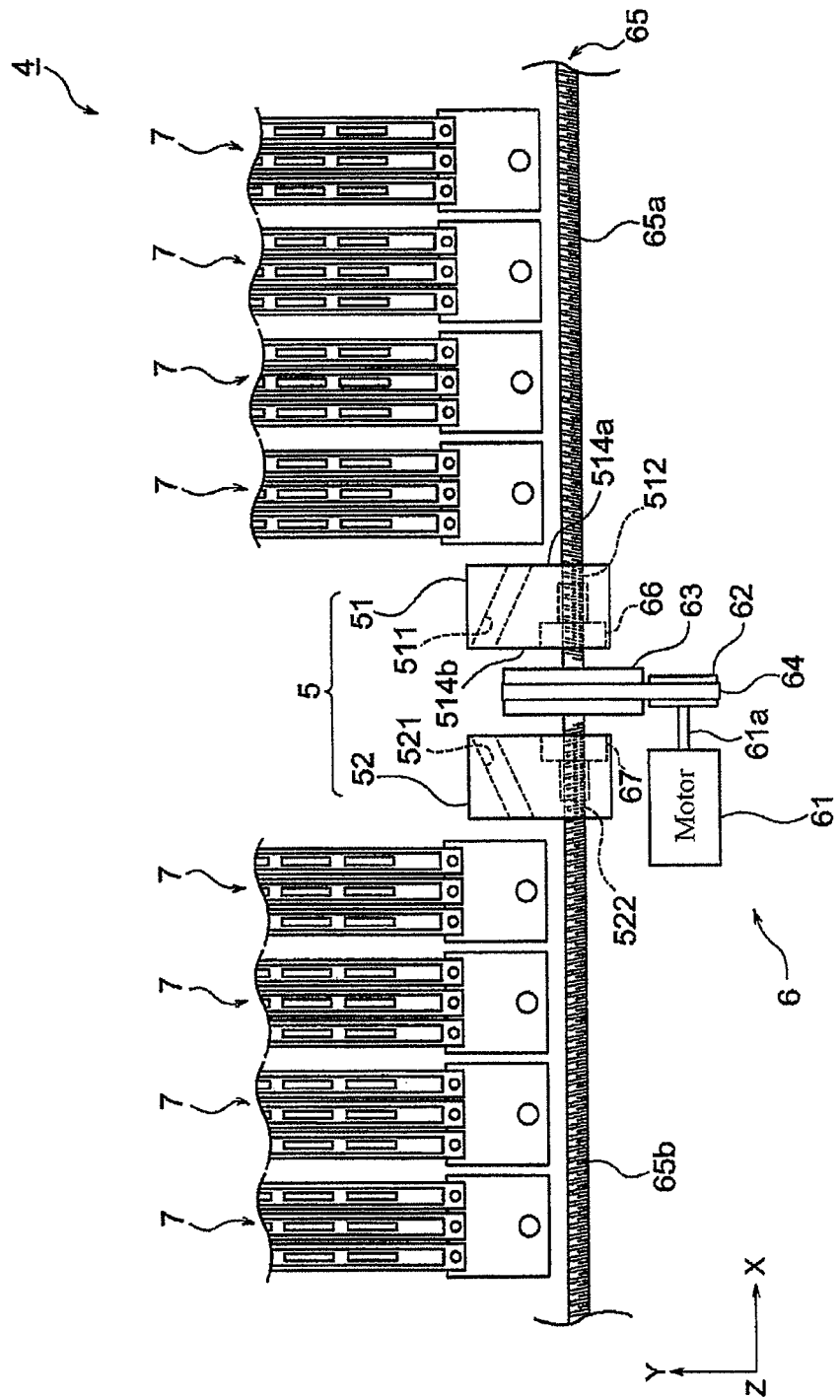
FIG. 3 is a top plan view of a connector attaching/detaching apparatus according to the first embodiment of the present invention, illustrating the status where all the connectors are fitted with one another.
Figure 4:
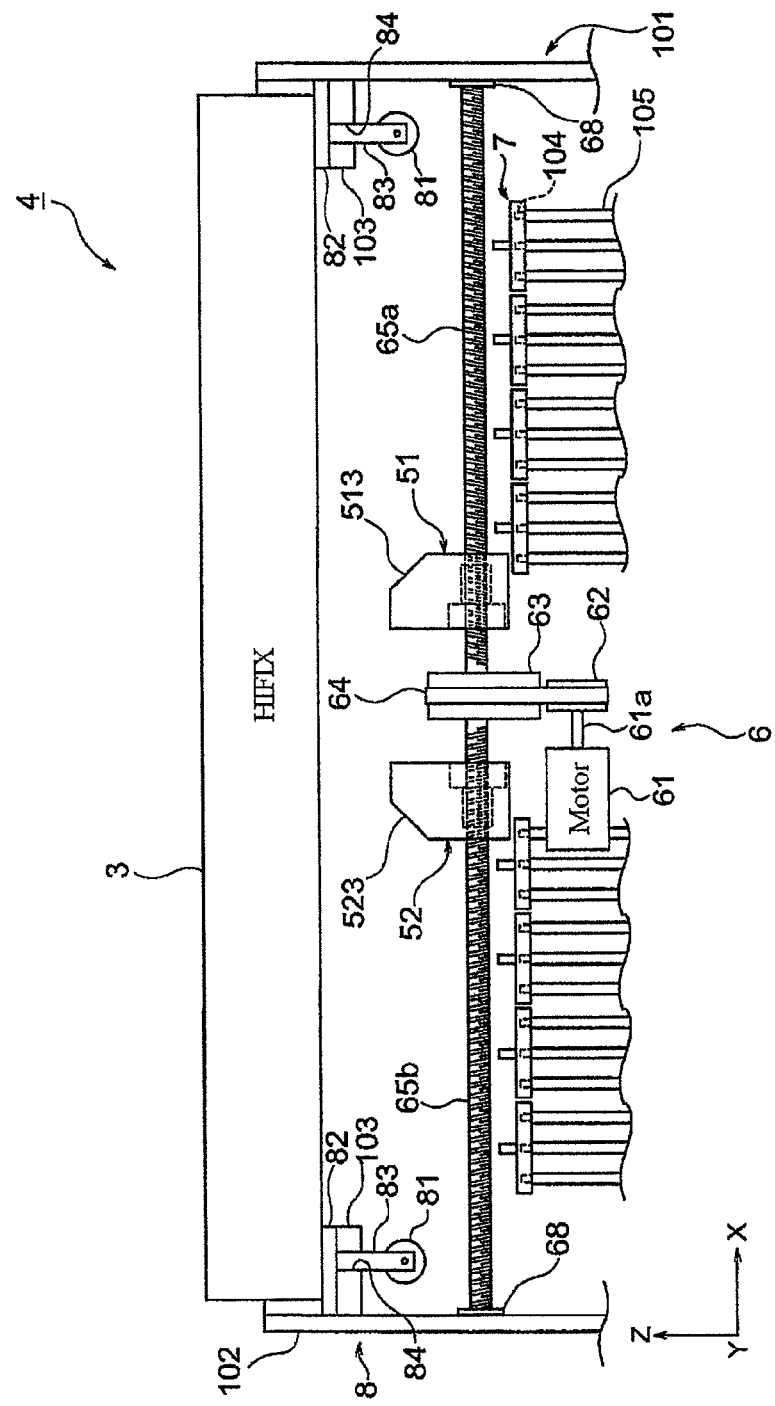
FIG. 4 is a front view of the connector attaching/detaching apparatus shown in FIG. 3.
Figure 5:
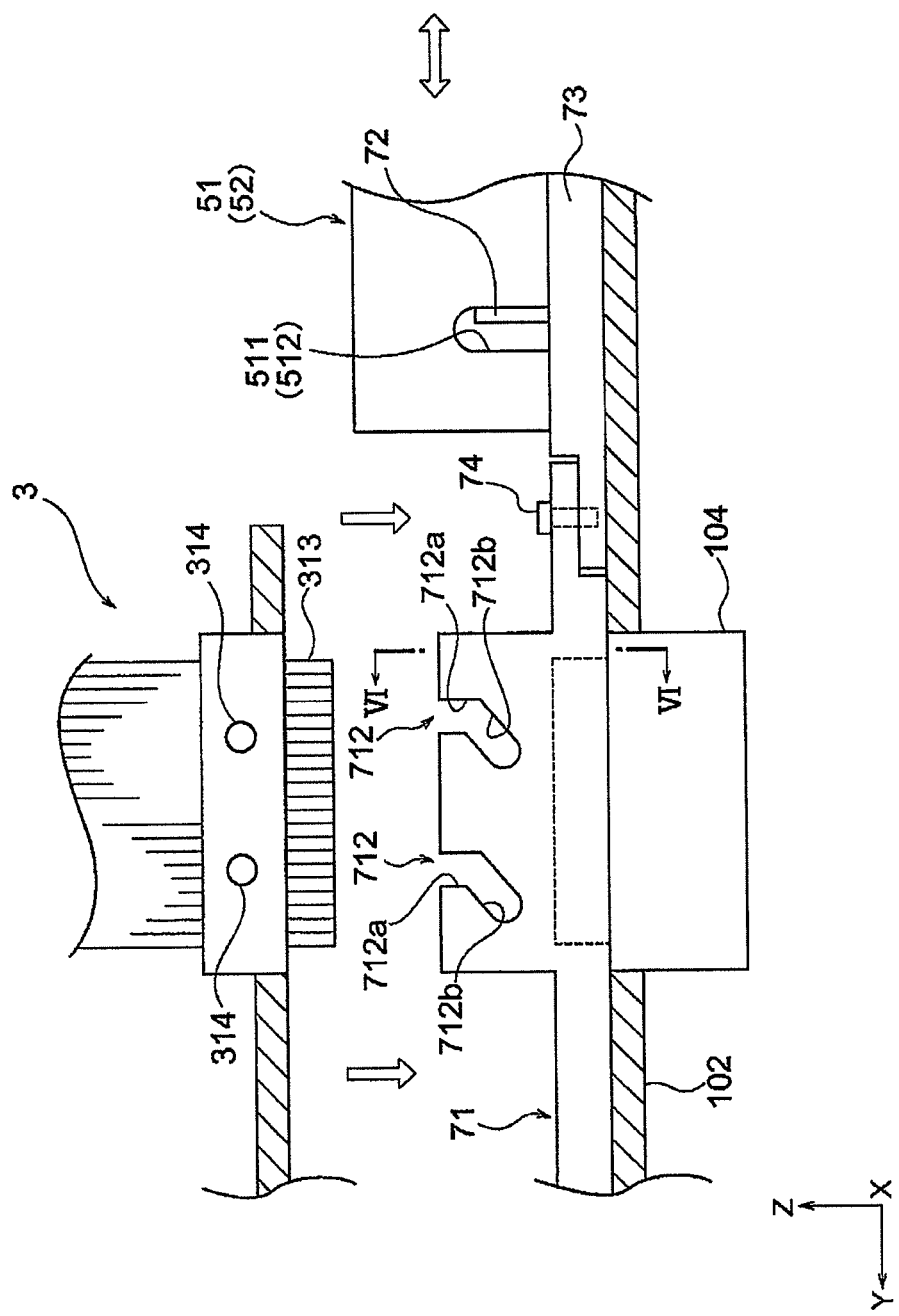
FIG. 5 is an enlarged view of a part V of FIG. 2.
Figure 6:
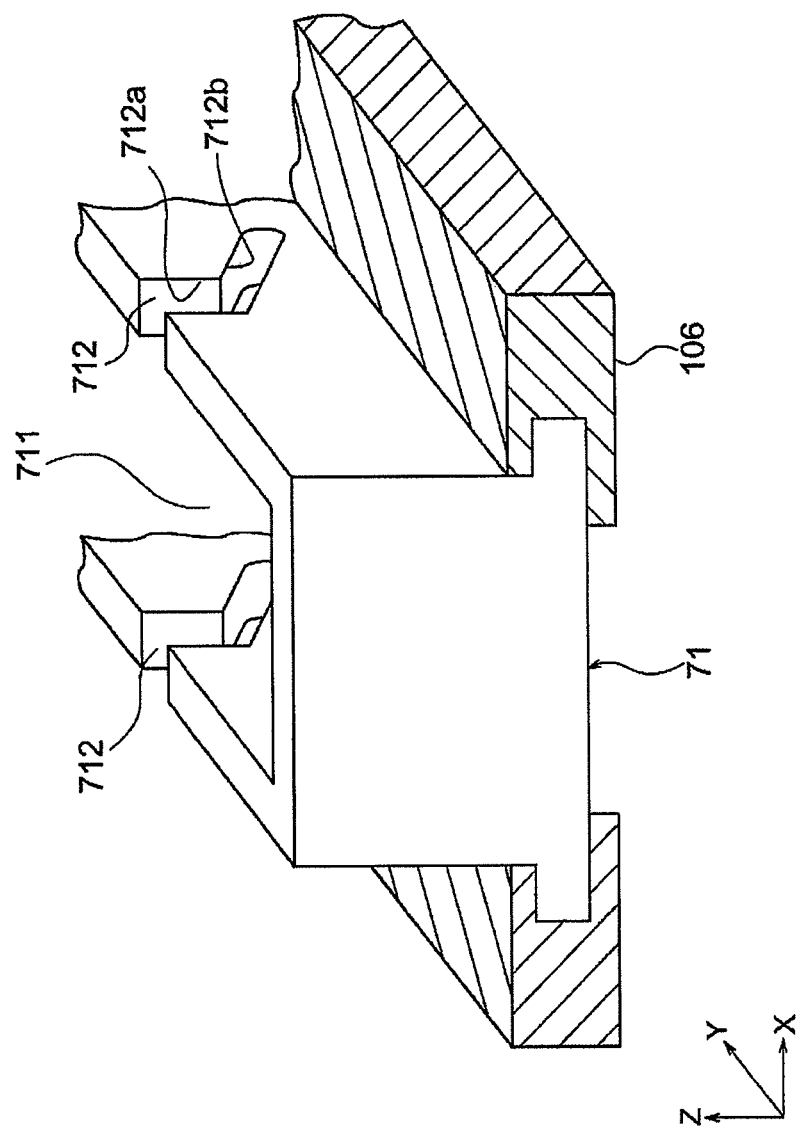
FIG. 6 is a cross-sectional perspective view along the line VI-VI of FIG. 5.
Figure 7:
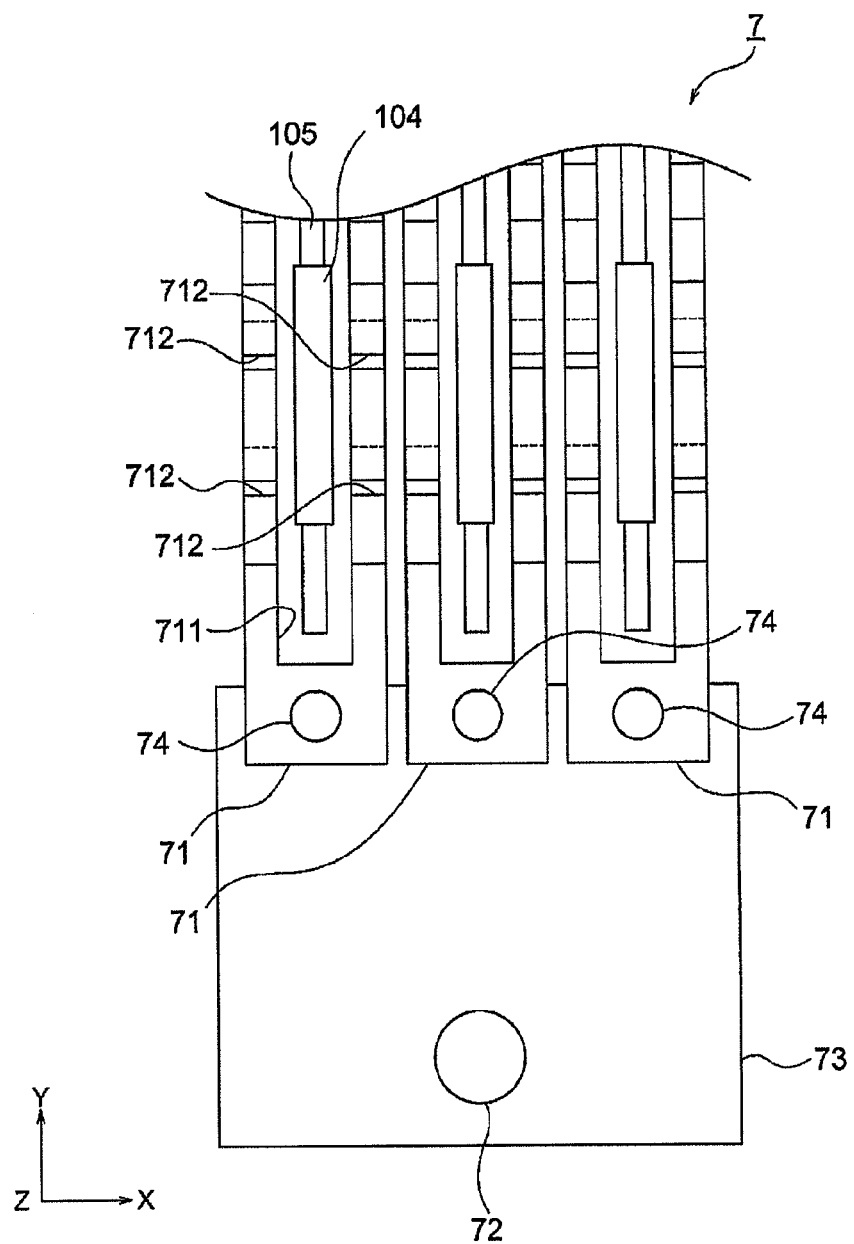
FIG. 7 is an enlarged plan view of a fitting member according to the first embodiment of the present invention.
Figure 8:
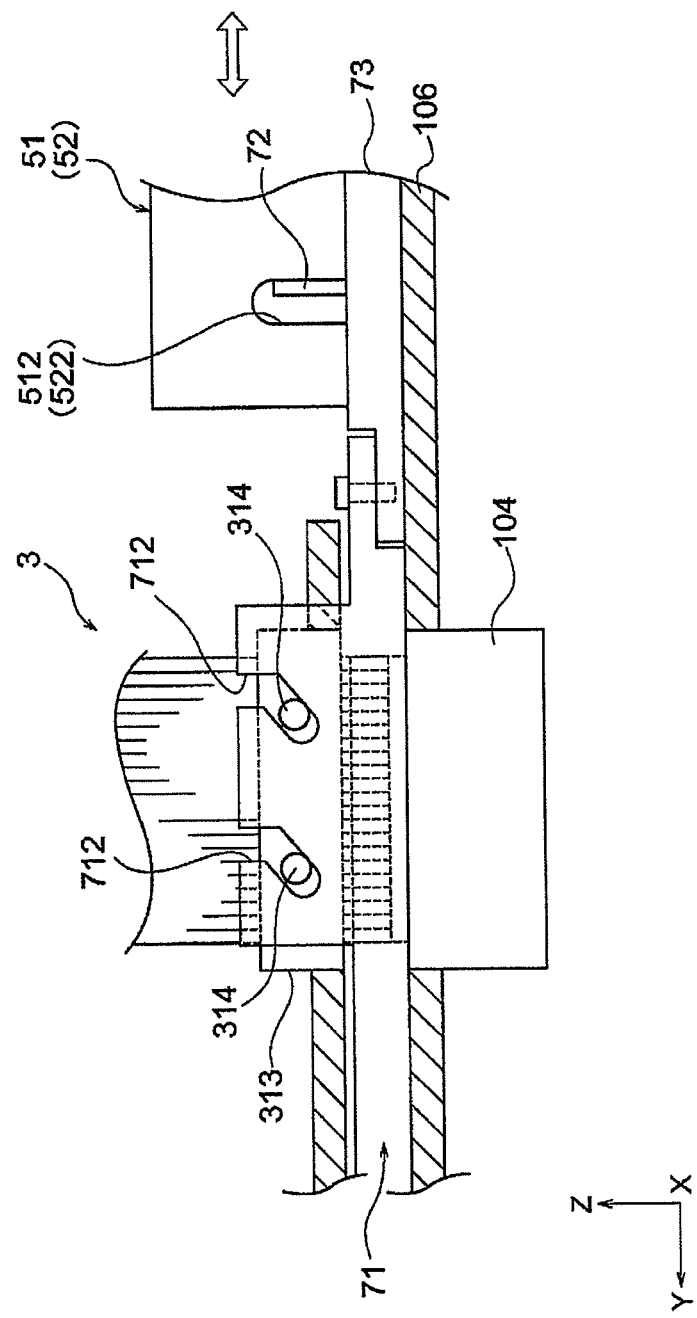
FIG. 8, which corresponds to FIG. 5, is a view illustrating the status where connectors are fitted with each other.

FIG. 3 is a top plan view of the connector attaching/detaching apparatus according to the first embodiment of the present invention, illustrating the status where all the connectors are fitted with one another, FIG. 4 is a front view of the connector attaching/detaching apparatus shown in FIG. 3, FIG. 5 is an enlarged view of a part V of FIG. 2, FIG. 6 is a cross-sectional perspective view along the line VI-VI of FIG. 5, FIG. 7 is an enlarged plan view of a fitting member according to the first embodiment of the present invention, and FIG. 8, which corresponds to FIG. 5, is an enlarged view illustrating the status where connectors are fitted with each other.

As shown in FIG. 3 and FIG. 4, the connector attaching/detaching apparatus 4 has fitting members 7 which causes the connectors 104 and 313 to fit with or separate from one another by sliding in the Y direction, guiding members 5 for causing the fitting members 7 to slide in the Y direction, a moving apparatus 6 for causing the guiding members 5 to move in the arrangement direction (the X direction) of the fitting members 7, and a HIFIX elevating mechanism 8 for causing the HIFIX 3 to move upward and downward.

According to the present embodiment, as shown in FIG. 3, eight sets of fitting members 7 are arranged at the upper surface of the test head main body 101. As shown in FIG. 7, each fitting member 7 comprises three frames 71 and a plate 73 for coupling these frames 71.

The frames 71 are fixed to each plate 73 by means of pins 74. On the upper surface of the plate 73, a cam follower 72 is provided approximately at the center in the X direction. This cam follower 72 is insertable into a guiding member 51, 52 as will be described later.

As shown in FIG. 6, the bottom portion of each frame 71 is held by a holding member 106 so as to be slidably movable in the Y direction. Note that the frame 71 in the present embodiment is a jig for fitting the connectors 104 and 313 with each other, rather than being a housing of a connector in its self.

As shown in FIG. 5 to FIG. 7, each frame 71 is formed therein with an insertion opening 711 into which each first connector 104 is inserted from the lower side, and guiding grooves 712 for guiding each second connector 313 toward each first connector 104.

The insertion opening 711 is of a elongate opening along the Y direction so as not to clash with the first connector 104 by the slide of the frame 71. In this example, as shown in FIG. 2, one frame 71 is inserted therein with four first connectors 104, which are implemented on the upper portion of an identical pin electronics card 105.

As shown in FIG. 5 to FIG. 7, the guiding grooves 712 are formed in both side surfaces of each frame 71, and four guiding grooves 712 are thus provided for one set of connectors 104 and 313. As shown in FIG. 5, each guiding groove 712 is comprised of a vertical part 712a and an inclined part 712b each having a width capable of being inserted with a projecting portion 314 of the HIFIX 3. The vertical part 712a is connected continuously to the inclined part 712b, which is inclined relative to the vertical part 712a.

In the case of fitting the first and second connectors 104 and 313 with one another, after causing the projecting portions 314 to pass through the vertical parts 712a and to move downward to the entrances of the inclined parts 712b, the frames 71 are caused to slide rightward in FIG. 5. This allows the projecting portions 314 to be lead into the inclined parts 712b and guided downward thereby causing the second connectors 313 and the first connectors 104 to fit with one another, as shown in FIG. 8.

On the other hand, in the case of separating the first and second connectors 104 and 313 from one another, the frames 71 are caused to slide leftward in FIG. 8, and the projecting portions 314 are thus pressed to the inclined parts 712b of the guiding grooves 712 and lifts up the second connectors 313 thereby separating the second connectors 313 from the first connectors 104. Note that, although not particularly illustrated, according to the first embodiment of the present invention, the HIFIX 3 involves a number of set of second connectors 313 corresponding to respective fitting members 7, each set being movable upward and downward independently from each other.

Figure 9:
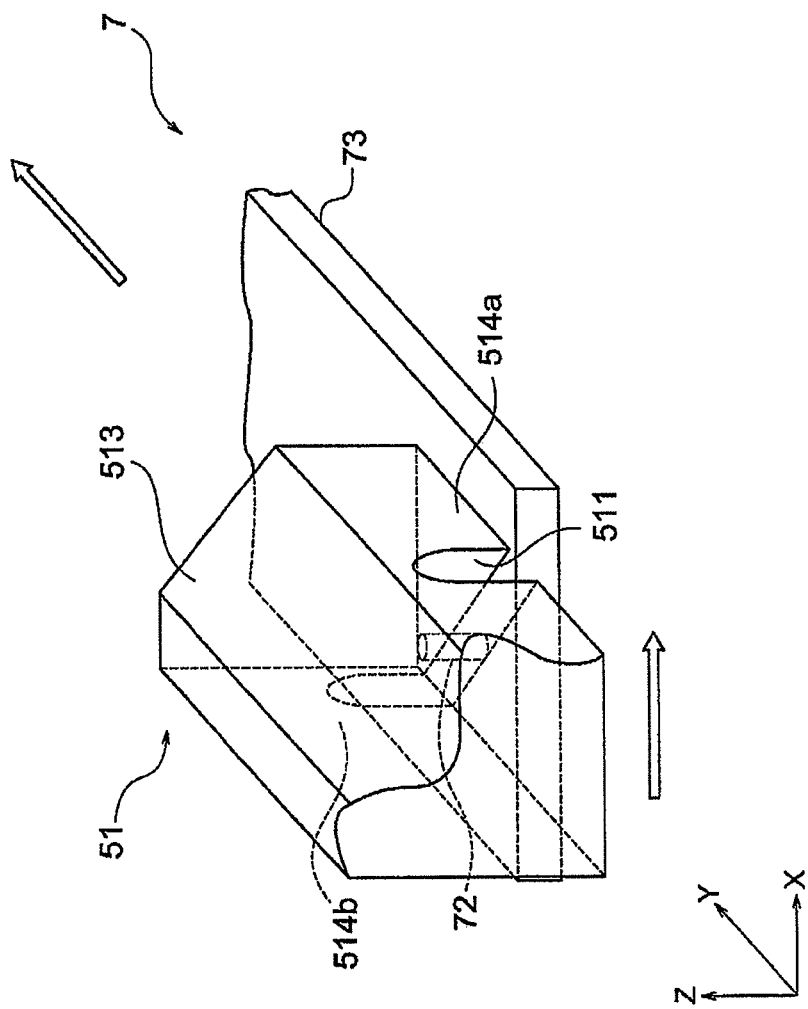
FIG. 9 is a perspective view of a guiding member and a fitting member according to the first embodiment of the present invention.

FIG. 9 is a perspective view of a first guiding member and a fitting member according to the first embodiment of the present invention.

As shown in FIG. 3, the guiding members 5 are comprised of a first guiding member 51 and a second guiding member 52. These two guiding members 51 and 52 are provided on a feed screw 65 as will be described later, and arranged in a symmetrical manner with respect to the center portion of the feed screw 65 as the symmetric center.

As shown in FIG. 9, the first guiding member 51 is a block formed with an inclined plane 513 by chamfering a side of a cube. As shown in FIG. 3, the first guiding member 51 is formed therein with a penetrating hole 512 penetrating between side surfaces 514a and 514b. The penetrating hole 512 is fixed thereto with a first nut 66 as will be described later. In addition, as shown in FIG. 9, at the bottom surface of the first guiding member 51, a cam groove 511 is formed to be inclined relative to the movement direction (the X direction) of the first guiding member 51.

In the case where the first guiding member 51 is required to cause the fitting members 7 to slide, the first guiding member 51 moves rightward in FIG. 9 such that cam follower 72 is pressed by the inner wall of the cam groove 511, thereby causing the fitting members 7 to slide in the Y direction.

The second guiding member 52 is a block having a shape symmetrical to the first guiding member 51 and being formed therein with a penetrating hole 522 penetrating the side surfaces thereof, similarly to the first guiding member 51. In addition, at the bottom surface of the second guiding member 52, a cam groove 521 is formed to be inclined symmetrically to the cam groove 511. Note that the relationship between the cam followers 72 of the plates 73 and the cam grooves 511 and 521 of the guiding members 51 and 52 may be reversed such that the plates 73 are formed therein with cam grooves while the guiding members 51 and 52 are provided thereon with cam followers.

As shown in FIG. 3 and FIG. 4, the moving apparatus 6 has a motor 61, a first pulley 62 coupled to the motor 61 via a driving shaft 61a, a second pulley 63 coupled to the feed screw 65, a timing belt 64 wound around the first pulley 62 and the second pulley 63, the feed screw 65 held by bearings 68 and 69 provided on a housing 102 (refer to FIG. 2) of the test head 10, and first and second nuts 66 and 67 into which the feed screw 65 is screwed and which are held by the feed screw 65 to be linearly movable along it.

As shown in FIG. 3 and FIG. 4, the first nut 66 is fixed to the penetrating hole 512 of the first guiding member 51 and the second nut 67 is fixed to the penetrating hole 522 of the second guiding member 52. The feed screw 65 has a first screw portion 65a formed with a right-hand thread and a second screw portion 65b formed with a left-hand thread. The first guiding member 51 and the second guiding member 52 are symmetrically positioned with respect to the center portion of the feed screw 65 as the symmetric center.

As the feed screw 65, a sliding screw, a trapezoidal screw, or a ball screw may be used. Moreover, alternatively to using the nuts, ball nuts may be used or thread grooves may directly be formed at the inner walls of the penetrating holes 512 and 522. Note that nuts in the present invention include, in addition to typical nuts, ball nuts and thread grooves directly formed at the guiding members 51 and 52.

Note that the connector attaching/detaching apparatus 4 may have plural first guiding members 51 and plural second guiding members 52. In this case, the plural first guiding members 51 are arranged with regular intervals on the first screw portion 65a of the feed screw 65. The second guiding members 52 are provided with the same number as the first guiding members 51 and also arranged with regular intervals on the second screw portion 65b of the feed screw 65. Each second guiding member 52 is positioned symmetrically with the corresponding first guiding members 51 with respect to the center portion of the feed screw 65 as the symmetric center.

If the motor 61 is driven in the moving apparatus 6, then the feed screw 65 rotates via the pulleys 62 and 63 and the timing belt 64. The rotating force of the feed screw 65 is converted by the first nut 66 and the second nut 67 into linear forces along the X direction thereby to cause the first and second guiding members 51 and 52 to move on the feed screw 65. Here, the feed screw 65 is formed with right-hand and left-hand threads in opposite directions, and a single directional rotation thus allows the first guiding member 51 and the second guiding member 52 to move in opposite directions. Note that the first guiding member 51 and the second guiding member 52 keep the symmetrically positional relationship even after their movement.

Figure 10:
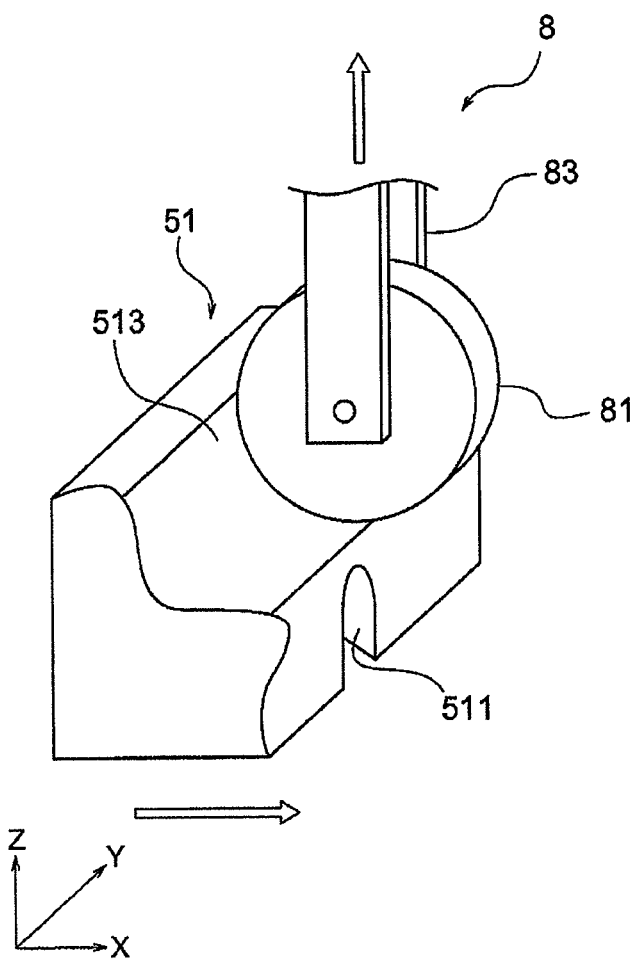
FIG. 10 is a perspective view illustrating the guiding member and a shaft of a HIFIX elevating apparatus according to the first embodiment of the present invention.

FIG. 10 illustrates the guiding member and a shaft of the HIFIX elevating apparatus according to the first embodiment of the present invention.

The HIFIX elevating mechanism 8 is comprised of, as shown in FIG. 4, shafts 83 pressing the HIFIX 3, guide plates 103 for holding the shafts 83 to be vertically movable, and HIFIX supporting members 82 attached to the top ends of the shafts 83 and supporting the HIFIX 3.

The guide plates 103 are provided thereon with bearings 84 for holding the shafts 83 to be linearly movable in the Z direction. As shown in FIG. 4 and FIG. 10, cam followers for elevating 81 are provided at the lower portions of the shafts 83. These cam followers for elevating 81 are provided so as to be capable of contacting with the inclined planes 513 and 523 of the first and second guiding members 51 and 52. Although not particularly limited, linear shafts may be used as the shafts 83, and sliding bearings are available for the bearings 84.

Figure 13:
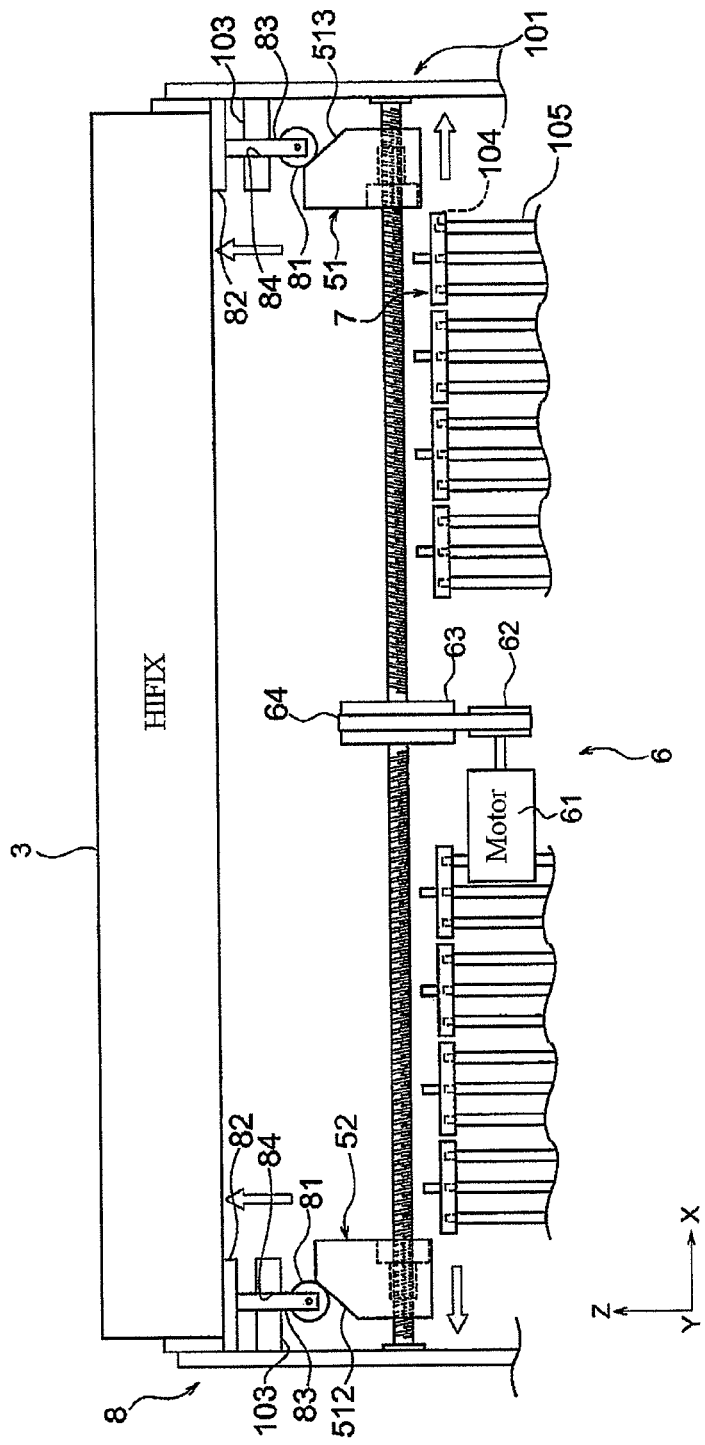
FIG. 13 is a front view of the connector attaching/detaching apparatus shown in FIG. 12.

If the HIFIX 3 is required to be lifted up, then the motor 61 is driven to cause the first and second guiding members 51 and 52 being on stand-by at the center of the feed screw 65 to move outward. As will be described later, as the first and second guiding members 51 and 52 engage with the fitting members 7 during moving thereby causing the fitting members 7 to slide. When the first and second guiding members 51 and 52 reach the positions where all the fitting members 7 have been completed to slide (refer to FIG. 13), the respective lower portions of the inclined planes 513 and 523 are contacted with the cam followers for elevating 81 as shown FIG. 10. If the first and second guiding members 51 and 52 are caused to further move outward, then the cam followers for elevating 81 moves upward along the slopes of the inclined planes 513 and 523. In response to this, the HIFIX 3 is lifted up via the shafts 83. Thus, the up-and-down movement of the HIFIX 3 is performed by the conversion of the thrust forces of the first and second guiding members 51 and 52 in the X direction into those in the Z direction due to the inclined planes 513 and 523 of the first and second guiding members 51 and 52 and the cam followers for elevating 81. Note that FIG. 13 illustrates the status where the upper portions of the inclined planes 513 and 523 of the first and second guiding members 51 and 52 are contacted with the cam followers for elevating 81 thereby lifting up the HIFIX 3.

On the contrary, if the HIFIX 3 is required to move downward, then the motor 61 is driven to oppositely rotate in the status where the first and second guiding members 51 and 52 are positioned at both ends of the feed screw (refer to FIG. 13), thereby causing the first and second guiding members 51 and 52 to move toward the center of the feed screw 65.

Responding to the movement of the first and second guiding members 51 and 52 toward the center, the cam followers for elevating 81 moves downward along the slopes of the inclined planes 513 and 523. In response to this, the HIFIX 3 moves downward by its own weight toward the test head main body 101. As the first and second guiding members 51 and 52 further move toward the center, the first and second guiding members 51 and 52 depart from the cam followers for elevating 81. After completing the downward movement of the HIFIX 3, the connectors 104 and 313 are initiated to be fitted with one another.

Note that the relationship between the cam followers for elevating 81 and the inclined planes 513 and 523 may be reversed such that the first and second guiding members 51 and 52 are provided thereon with cam followers while the lower portions of the shafts 83 are provided thereon with inclined planes. Moreover, inclined planes may be formed on the lower portions of the shafts 83, and inclined planes are thus be enough to be formed at least on either of the shafts 83 or the first and second guiding members 51 and 52.

Figure 11:
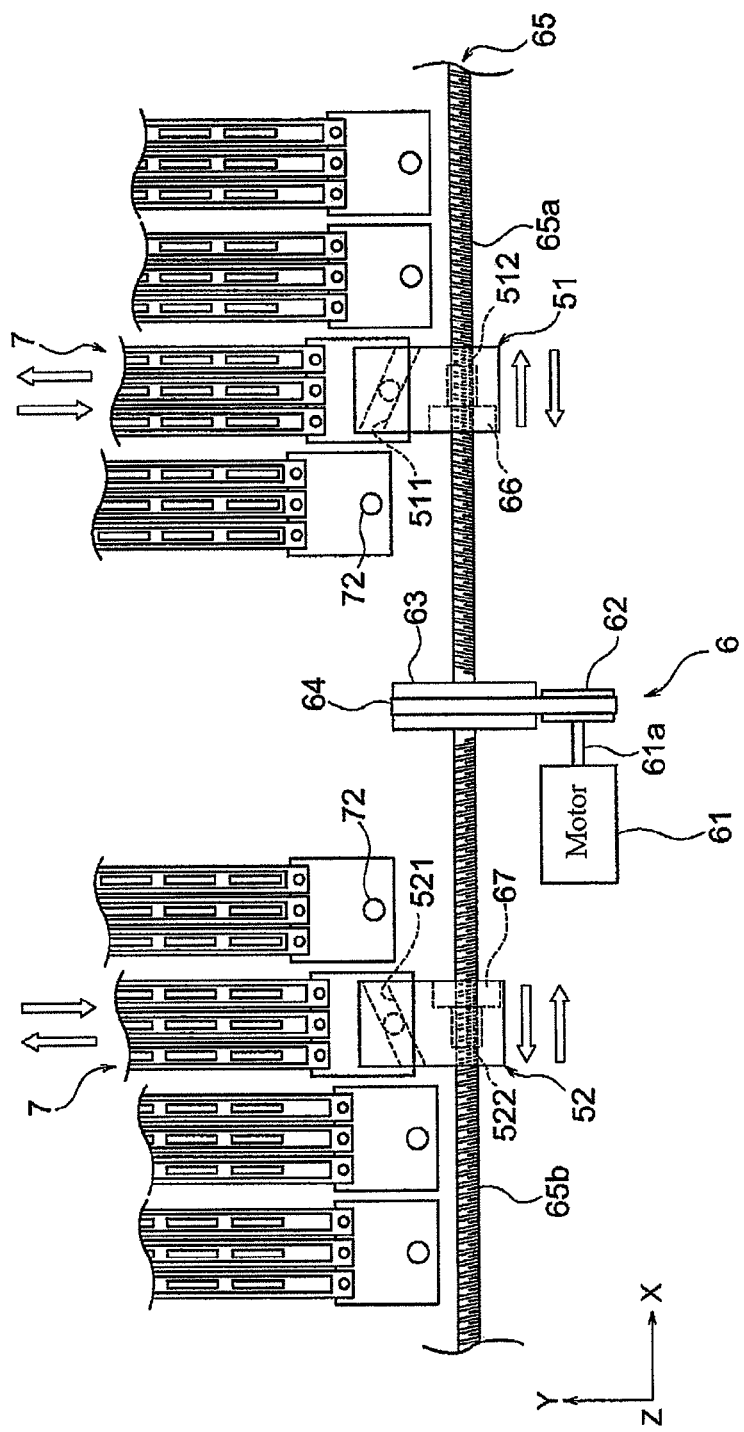
FIG. 11 is a top plan view illustrating the operation of the connector attaching/detaching apparatus according to the first embodiment of the present invention, and also illustrating the status where the fitting members are sliding by the movement of the guiding members.
Figure 12:
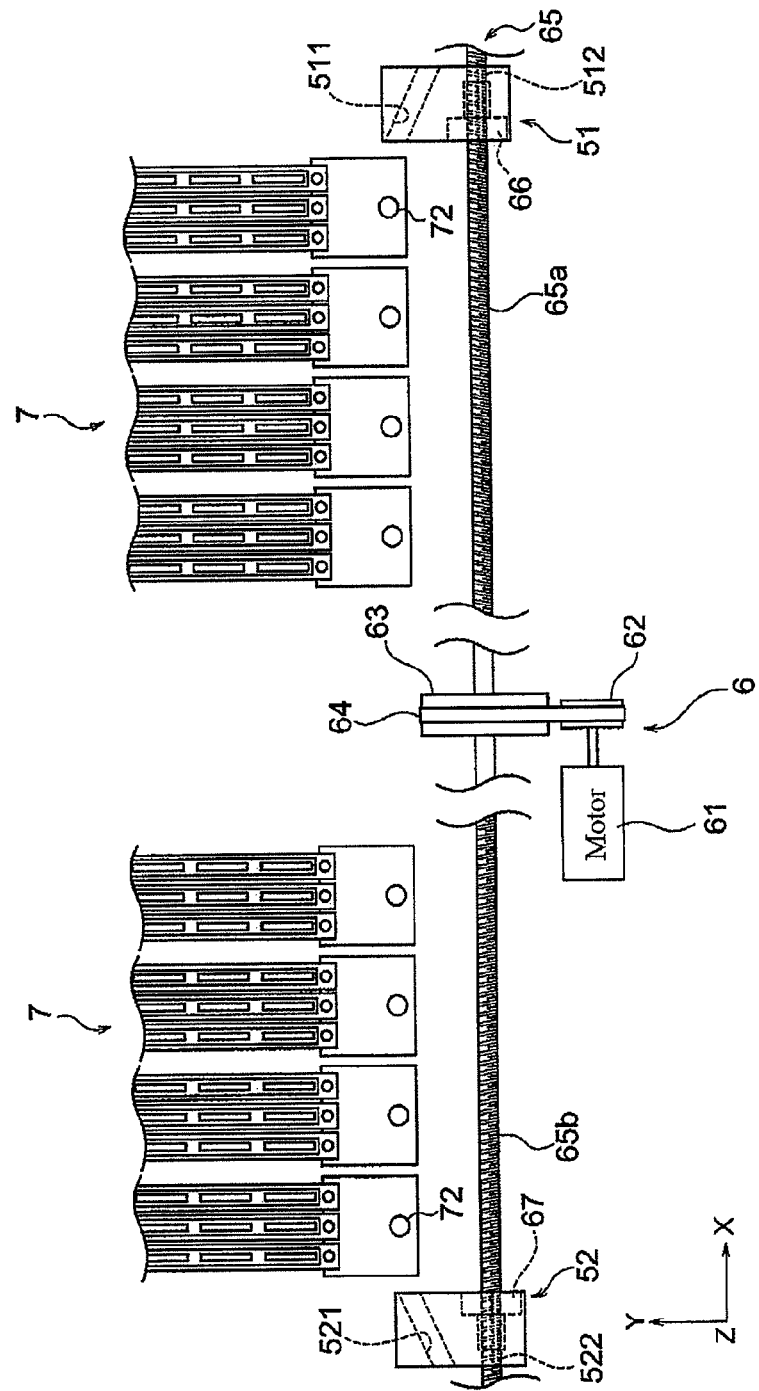
FIG. 12 is a top plan view of the connector attaching/detaching apparatus according to the first embodiment of the present invention, illustrating the status where all the connecters have completed to be separated from one another.

FIG. 11 is a top plan view illustrating the operation of the connector attaching/detaching apparatus according to the first embodiment of the present invention, and also illustrating the status where the fitting members are sliding by the movement of the guiding members, FIG. 12 is a top plan view of the connector attaching/detaching apparatus according to the first embodiment of the present invention, illustrating the status where all the connecters have completed to be separated from one another, and FIG. 13 is a front view of the connector attaching/detaching apparatus shown in FIG. 12.

Hereinafter, a sequence of the operation of the connector attaching/detaching apparatus 4 will be described.

Prior to attaching the HIFIX 3, as shown in FIG. 12 and FIG. 13, the first and second guiding members 51 and 52 are on stand-by at respective end positions of the feed screw 65. If the HIFIX 3 is placed on the test head main body 101, then the above HIFIX 3 is caused to move downward and the fitting operation for the first and second connectors 104 and 313 starts, as will be described hereinafter.

The motor 61 is driven to transmit a rotation to the feed screw 65. This allows the first and second guiding members 51 and 52 to move toward the center of the feed screw 65. In response to this, the HIFIX 3 moves downward and the second connectors 313 are thus positioned at where capable of fitting with the first connectors 104. Moreover, the first and second guiding members 51 and 52 are caused by the movement thereof to be engaged with respective fitting members 7 located at both ends, and fitting members 7 are thus caused to move in the Y direction thereby allowing the first and second connectors 104 and 313 to fit with one another. As the first and second guiding members 51 and 52 further moves, they are to be engaged with the subsequent fitting members 7. FIG. 11 illustrates the condition where the first and second guiding members 51 and 52 are engaged with respective fitting members 7 next to the center. In this manner, as the first and second guiding members 51 and 52 proceed inwardly, they are sequentially engaged with plural fitting members 7 so as to cause them to slide in the Y direction, and all the connectors 104 and the 313 are thus to be completed to fit with one another when the first and second guiding members 51 and 52 reach the center of the feed screw 65, as shown in FIG. 3.

The operation for separating the connectors 104 and 313 having fitted with one another to detach the HIFIX will now be described.

As described above, in the status where all the connectors 104 and 313 fit with one another, the first and second guiding members 51 and 52 are positioned at the center of the feed screw 65, as shown in FIG. 3. From this status, if the motor 61 is driven to rotate in the opposite direction, then the first and second guiding members 51 and 52 move outward. Respective first and second guiding members 51 and 52 come to be sequentially engaged with the fitting members 7 thereby causing the first and second connectors 104 and 313 to be separated from one another. When the first and second guiding members 51 and 52 reach both ends of the feed screw 65 after causing all the connectors 104 and 313 to be separated from one another, the cam followers for elevating 81 come into contact with the inclined planes 513 and 523, and the HIFIX 3 is then lifted upward thereby being enabled to be detached.

As described hereinbefore, according to the present invention, attaching and detaching of considerable number of connectors 104 and 313 required for the connection between the HIFIX 3 and the test head main body 101 are performed separately with each predetermined number, and therefore the small capacity of a power source comes to be available for the attaching and detaching of the connectors 104 and 313.

According to the present embodiment, as shown in FIG. 2, one frame 71 is inserted therein with four first connectors 104 while one fitting member 7 has three frames 71 as shown in FIG. 3. Moreover, the connector attaching/detaching apparatus 4 according to the present embodiment comprises eight sets of fitting members 7. Therefore, the test head 10 has 96 (ninety six) first connectors 104. Note that the HIFIX 3 is also provided thereon with 96 second connectors 313 corresponding to the first connectors 104. At the time of attaching the HIFIX 3, a power is required for fitting all these 96 first connectors 104 and these 96 second connectors 313. In contrast, according to the present embodiment, the first and second guiding members 51 and 52 cause respective one set of the fitting members 7 at a time to slide, thereby performing separately four times of fitting the connectors 104 and 313. Thus each number of connectors 104 and 313 is 24 (twenty four) for fitting the first and second guiding members 51 and 52 at a time. Consequently, the motor 61 used in the present embodiment is enough to have a driving power corresponding to that for causing 24 sets of the connectors 104 and 313 to concurrently fit with one another, and the required driving power is thus reduced to be quarter relative to the case of causing all the connectors 104 and 313 to fit with one another at the same time. Note that the number of connectors provided within a test head is not particularly limited and the number of connectors to be caused to concurrently fit with one another may be arbitrarily set.

<Second Embodiment>

The configuration of a connector attaching/detaching apparatus according to the second embodiment of the present invention will be described with reference to FIG. 14 and FIG. 15. Note that the same components as in the first embodiment are denoted by the same reference numerals and omitted to be described. The configuration of the connector attaching/detaching apparatus according to the second embodiment is different from that of the first embodiment in a configuration of the moving apparatus.

Figure 14:
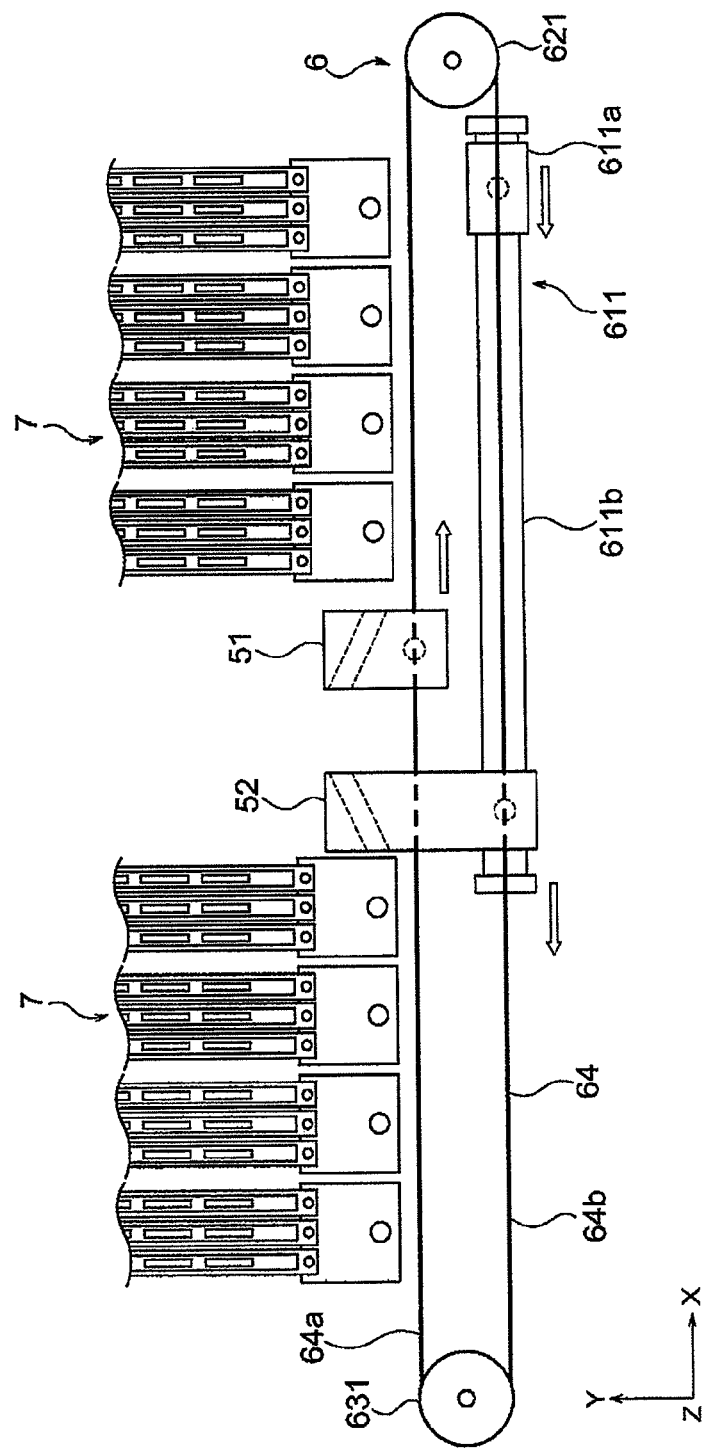
FIG. 14 is a top plan view of a connector attaching/detaching apparatus according to a second embodiment.
Figure 15:
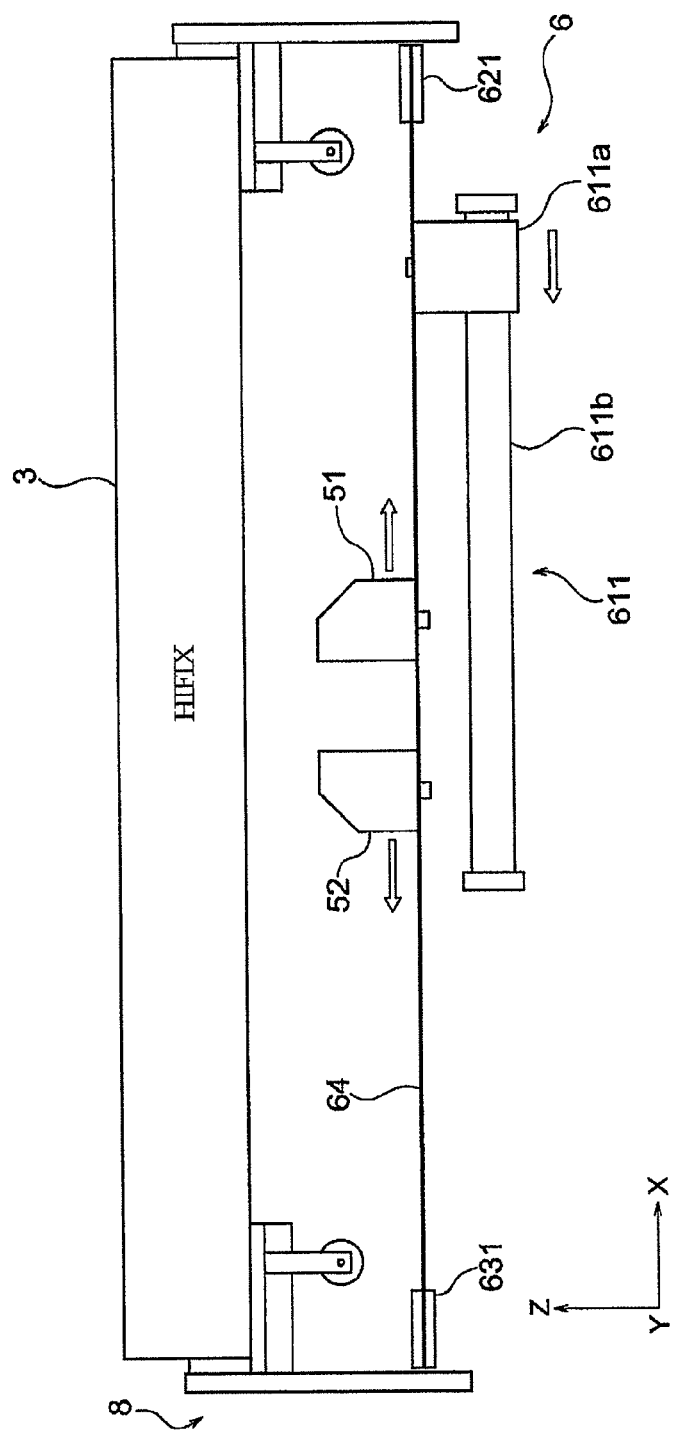
FIG. 15 is a front view of the connector attaching/detaching apparatus shown in FIG. 14.
Figure 16:
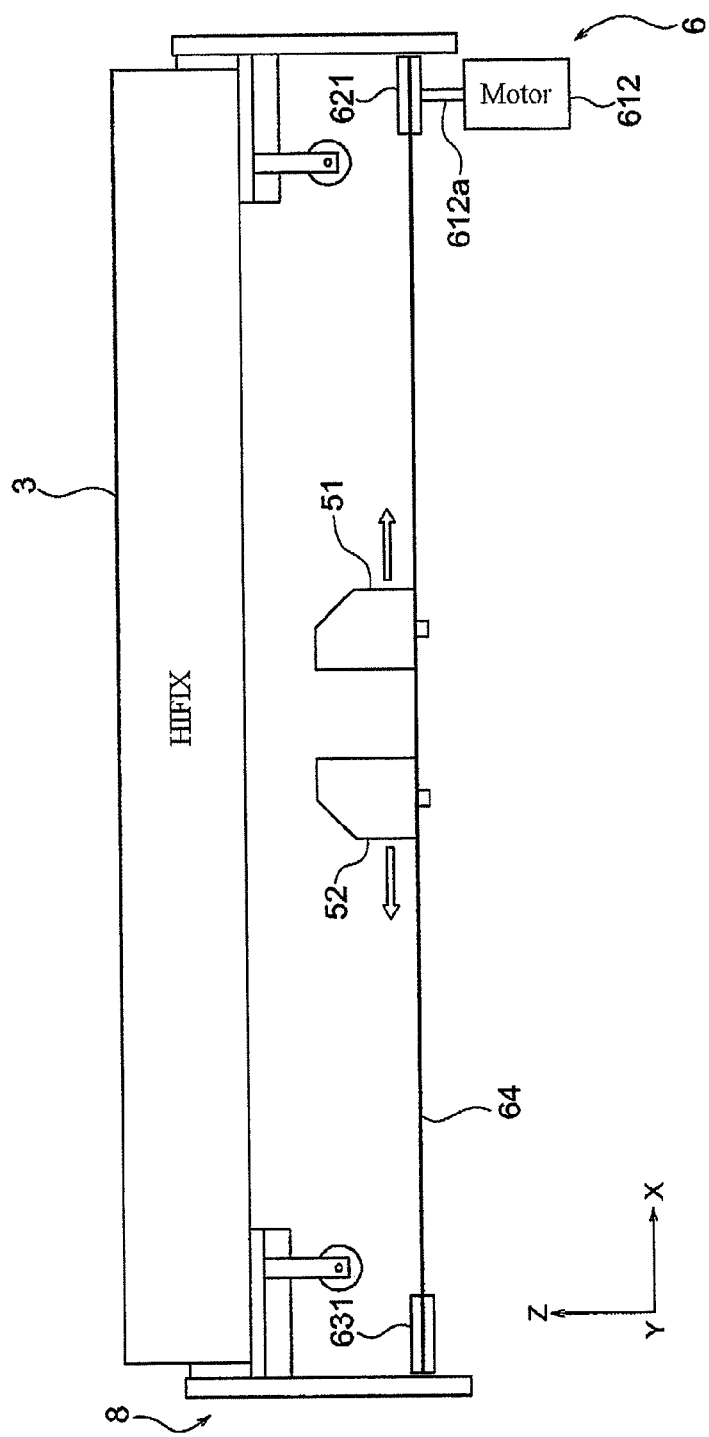
FIG. 16 is a front view of a connector attaching/detaching apparatus according to a third embodiment of the present invention.

FIG. 14 is a top plan view of the connector attaching/detaching apparatus according to the second embodiment of the present invention, FIG. 15 is a front view of the connector attaching/detaching apparatus shown in FIG. 14, and FIG. 16 is a front view of a connector attaching/detaching apparatus according to the third embodiment of the present invention.

As shown in FIG. 14 and FIG. 15, the moving apparatus 6 according to the second embodiment of the present invention has a first and a second pulleys 621 and 631, a timing belt 64 wound around the first and second pulleys 621 and 631, and an air cylinder 611 driving the timing belt 64 to run.

Both the first and second pulleys 621 and 631 are provided further outside relative to the outermost fitting members 7, as shown in FIG. 14 and FIG. 15, and rotation axes of these pulleys 621 and 631 are along the Z axis. The timing belt 64 is provided in the arrangement direction (X direction) of the fitting members 7 so as to be wound around these pulleys 621 and 631.

As shown in FIG. 14 and FIG. 15, the first and second guiding members 51 and 52 are coupled to the timing belt 64. The first guiding member 51 is fixed to a part 64a of the timing belt 64 on the side of the fitting members 7. On the other hand, the second guiding member 52 is fixed to a part 64b of the timing belt 64, which is folded back from the part 64a on the side of the fitting members 7 beyond the pulleys 621 and 631. Note that the second guiding member 52 is longer in the Y direction than the first guiding member 51, because the second guiding member 52 is required to extend across the part 64a of the timing belt 64 on the side of the fitting members 7.

As the air cylinder 611, a rod-less-base cylinder may be used, for example. As shown in FIG. 14 and FIG. 15, the air cylinder 611 comprises a cylinder tube 611b reciprocating a piston (not shown), and a movable table 611a coupled to that piston. The movable table 611a of the air cylinder 611 is coupled to the timing belt 64. Supplying the air cylinder 611 with air allows the reciprocating motion of the movable table 611a on the cylinder tube 611b. By the thrust force of the reciprocating motion of the movable table 611a, the timing belt 64 is driven to run in the X direction. This allows the first guiding member 51 and the second guiding member 52 to move in opposite directions relative to each other.

Note that, as shown in FIG. 16, a motor 612 may be substituted for the air cylinder as the driving power source of the moving apparatus. In this case, the driving shaft 612a of the motor 612 is coupled to the first pulley 621.

It is to be noted that the embodiments as explained hereinbefore are described to facilitate understanding of the present invention and are not described to limit the present invention. Therefore, it is intended that the elements disclosed in the above embodiments include all design changes and equivalents to fall within the technical scope of the present invention.

The invention claimed is:

1. A connector attaching/detaching apparatus for attaching and detaching connectors which electrically connect an interface apparatus and a test head main body in a test head, wherein the connector attaching/detaching apparatus comprises:

a plurality of fitting devices that cause the connectors to fit with or separate from one another by sliding;

a first guiding member that sequentially causes the plurality of fitting devices to slide by moving in an arrangement direction of the fitting devices; and a moving device that causes the first guiding member to move in the arrangement direction of the fitting devices.

2. The connector attaching/detaching apparatus as set forth in claim 1, further comprising a second guiding member that is arranged symmetrically to the first guiding member and sequentially causes the plurality of fitting devices to slide by moving in the arrangement direction of the fitting devices, wherein the moving device causes the second guiding member to move in opposite direction to a movement direction of the first guiding member.

3. The connector attaching/detaching apparatus as set forth in claim 2, wherein each of the first and second guiding members has a first cam groove or a first cam follower, and the fitting devices have a second cam follower or a second cam groove corresponding to the first cam groove or the first cam follower.

4. The connector attaching/detaching apparatus as set forth in claim 2, further comprising a conversion mechanism that converts a force along the arrangement direction of the fitting devices into a force along a direction of attaching and detaching of the connectors, wherein the conversion mechanism causes the interface apparatus to move upward and downward by pressing due to movement of the first and second guiding members.

5. The connector attaching/detaching apparatus as set forth in claim 4, wherein the conversion mechanism has:

a first contacting portion provided on each of the first and second guiding members; and a second contacting portion which is provided on a shaft supporting the interface apparatus and contacts with the first contacting portion, and at least one of the first contacting portion and the second contact portion is inclined.

6. The connector attaching/detaching apparatus as set forth in claim 2, wherein the moving device has:

a motor;

a feed screw rotatable by driving force of the motor; and nuts into which the feed screw is screwed, the nuts are coupled to each of the first and second guiding members, and each of the first and second guiding members linearly moves along an axis direction of the feed screw by rotation of the feed screw.

7. The connector attaching/detaching apparatus as set forth in claim 6, wherein the feed screw has:

a first screw portion formed with a right-hand thread; and a second screw portion formed with a left-hand thread, the first guiding member is arranged at the first screw portion, and the second guiding member is arranged at the second screw portion so as to be positioned symmetrically to the first guiding member.

8. The connector attaching/detaching apparatus as set forth in claim 2, wherein the moving device has:

a motor;

a plurality of pulleys rotating by driving force of the motor; and an endless-type belt wound around the plurality of pulleys, the first and second guiding members are held by the belt, and the belt is capable of running by rotation of the plurality of pulleys.

9. The connector attaching/detaching apparatus as set forth in claim 2, wherein the moving device has:

an air cylinder;

a plurality of pulleys supported to be rotatable, and an endless-type belt wound around the plurality of pulleys, the first and second guiding members are held by the belt, and the belt is coupled to the air cylinder and is capable of running by thrust force of the air cylinder.

10. A test head in an electronic component test apparatus, wherein the test head has the connector attaching/detaching apparatus as set forth in claim 1.

* * * * *